United States Patent [19]

Murayama et al.

[11] 3,962,988

[45] June 15, 1976

[54] ION-PLATING APPARATUS HAVING AN H.F. ELECTRODE FOR PROVIDING AN H.F. GLOW DISCHARGE REGION

[75] Inventors: Yoichi Murayama, Tokyo; Masayuki Matsumoto; Kunihiro Kashiwagi, both of Saitama, all of Japan

[73] Assignees: Yoichi Murayama, Nippon Electric Varian Ltd.; Koito Manufacturing Co., Ltd., both of Tokyo, Japan

[22] Filed: Mar. 1, 1974

[21] Appl. No.: 447,260

[30] Foreign Application Priority Data

Mar. 5, 1973   Japan.............................. 48-25883
Mar. 20, 1973  Japan.............................. 48-32228
Nov. 30, 1973  Japan.............................. 48-135164

[52] U.S. Cl. ............................................. 118/49.1
[51] Int. Cl.² ......................................... C23C 13/12
[58] Field of Search.................... 118/49.1, 49.5; 117/93.1 GD; 315/248; 219/10.57, 10.81

[56] References Cited
UNITED STATES PATENTS

| | | |
|---|---|---|
| 3,069,286 | 12/1962 | Hall............................ 117/93.1 GD |
| 3,318,790 | 5/1967 | Carbajal et al.............. 117/93.1 GD |
| 3,329,601 | 7/1967 | Mattox......................... 118/49.5 UX |
| 3,371,649 | 3/1968 | Gowen............................... 118/49.1 |
| 3,394,066 | 7/1968 | Miles....................... 117/93.1 GD X |
| 3,594,238 | 7/1971 | Hoeckelman................ 117/93.1 GD |
| 3,847,114 | 11/1974 | Kiyozumi.......................... 118/49.1 |

*Primary Examiner*—Morris Kaplan
*Attorney, Agent, or Firm*—Ostrolenk, Faber, Gerb & Soffen

[57] ABSTRACT

Apparatus for coating a substrate with a material comprises means for providing an h.f. glow discharge region adjacent to a source for the material. The h.f. glow discharge ionizes the particles of the material of the source evaporated therefrom, instead of a conventional d.c. discharge produced by a d.c. electric field provided between the source and substrate. The h.f. glow discharge region providing means may comprise an h.f. electrode disposed in a gas-filled space of the apparatus between the evaporation source and the substrate and means for applying an h.f. electric voltage between the h.f. electrode and the evaporation source.

17 Claims, 6 Drawing Figures

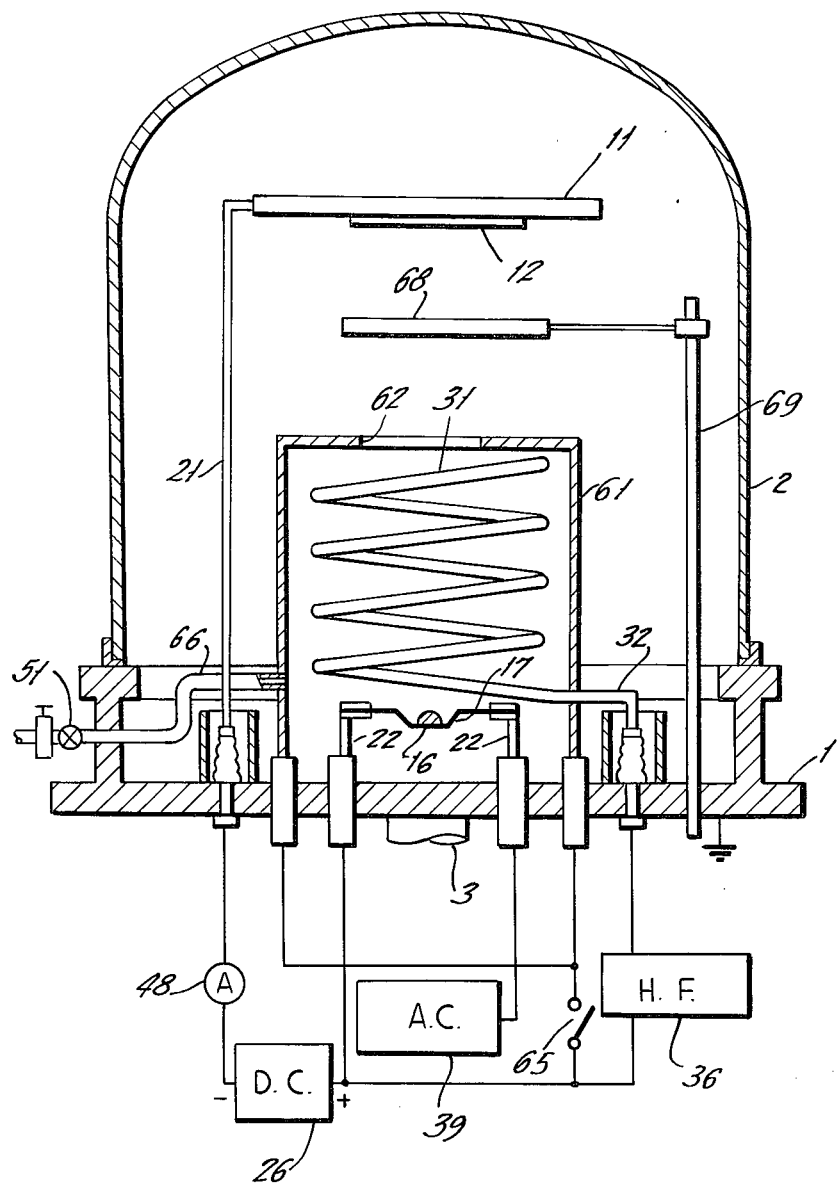

ION-PLATING APPARATUS HAVING AN H.F. ELECTRODE FOR PROVIDING AN H.F. GLOW DISCHARGE REGION

BACKGROUND OF THE INVENTION

This invention relates to ion-plating apparatus for coating a substrate with a desired material.

A vacuum evaporating device comprises a source of a material to be evaporated and a holder for a substrate on which the material is to be evaporated. In contrast, conventional ion-plating apparatus comprises a source of the material to be ion-plated and means for applying a d.c. electric voltage between the source and substrate holder. In operation, the d.c. voltage produces a glow discharge in an atmosphere of an inert gas, such as argon or neon, of between $10^{-1}$ and $10^{-2}$ Torr. The glow discharge causes the material of the source to be sputtered, ionizes the particles of the material sputtered from the source, and accelerates the ionized particles towards the substrate to impinge thereon and adhere thereto.

Inasmuch as the d.c. voltage contributes to ionization and acceleration, the film obtained by ion-plating apparatus more tenaciously adheres to the substrate than a similar film coated by a vacuum evaporation device. In addition, it is possible with ion-plating apparatus to select the materials of the source and substrate from a wide variety of materials in view of the principles of operation thereof.

It has, however, been difficult with conventional ion-plating apparatus to control the temperature of the substrate because the substrate is bombarded not only by the ionized particles of the sputtered material but also by ions of the inert gas. This, in turn, renders it practically impossible to coat a substrate incapable of enduring a high temperature. In addition, it has often been experienced that back sputtering occurs during ion-plating to damage the coating growing on the substrate. It has now been found that these defects of conventional ion-plating apparatus result from the relatively high pressure at which ion-plating is carried out. Furthermore, the structure and characteristics of the coating obtained by conventional ion-plating apparatus have not been satisfactory for some applications.

SUMMARY OF THE INVENTION

It is therefore an object of the present invention to provide ion-plating apparatus operable at a pressure of $10^{-3}$ Torr or less.

It is another object of this invention to provide ion-plating apparatus capable of keeping the temperature of a substrate to be ion-plated as low as possible.

It is still another object of this invention to provide ion-plating apparatus capable of producing a stable glow discharge.

It is a subordinate object of this invention to provide ion-plating apparatus capable of providing a coating of specific structure and characteristics on a substrate.

Apparatus for coating a substrate with a material includes a source for the material and a holder for the substrate, both placed in a gas-filled space. The apparatus further includes first means for producing a d.c. electric field between the source and holder for carrying out the coating. In accordance with this invention, the apparatus comprises second means for evaporating the material of the source and third means for producing a high-frequency electric field in the gas-filled space to provide a high-frequency glow discharge region adjacent to the source.

The high-frequency glow discharge ionizes the particles of the evaporated material. The d.c. electric field accelerates the ionized particles towards the substrate to ion-plate the same. In this connection, it should be pointed out that the gas-filled space may be filled merely with an inert gas, whereby the substrate is ion-plated with the material of the source. Alternatively, the space may be filled with a mixture of an inert gas and an active gas, whereby the substrate is ion-plated with a compound produced by a chemical reaction of the material of the source with the active gas. The "source for the material" therefore provides either that material or the constituent of that material with which the substrate is to be coated.

Preferably, the third means comprises a high-frequency electrode of a substantial ring shape disposed in the gas-filled space between the source and holder and means for applying a high-frequency electric voltage between the high-frequency electrode and the source.

With this preferred aspect of this invention, the d.c. electric field produced between the high-frequency electrode and the source is in effect cancelled by the high-frequency electric field. In this connection, it should be understood that the d.c. electric field produced by the first means may not necessarily reach the source. It should also be understood that the "substantial ring shape" may be of a shape of a coil of one or more turns or may be rectangular in outline.

In another preferred aspect of this invention, a net electrode is disposed in the gas-filled space adjacent to the holder. In this case, the first means comprises means for applying a d.c. electric voltage between the net electrode and the source. If desired, the apparatus may further comprise a pair of auxiliary electrodes disposed in the gas-filled space between the net electrode and the holder and means for applying a second d.c. electric voltage between the auxiliary electrode to produce an auxiliary d.c. electric field transverse to the d.c. electric field produced by the first means.

With this latter preferred aspect of this invention, the net electrode prevents the d.c. electric field produced by the first means from actually reaching the holder. The d.c. electric field produced by the first means "between the source and holder" should therefore be construed to include this distribution of the electric field. The auxiliary d.c. electric field, when produced, serves to give desired structure and characteristics to the film coated on the substrate.

BRIEF DESCRIPTION OF THE DRAWING

FIG. 6 is a schematic vertical sectional view of another modification of the first embodiment.

DESCRIPTION OF THE PREFERRED EMBODIMENTS

Figure 1:
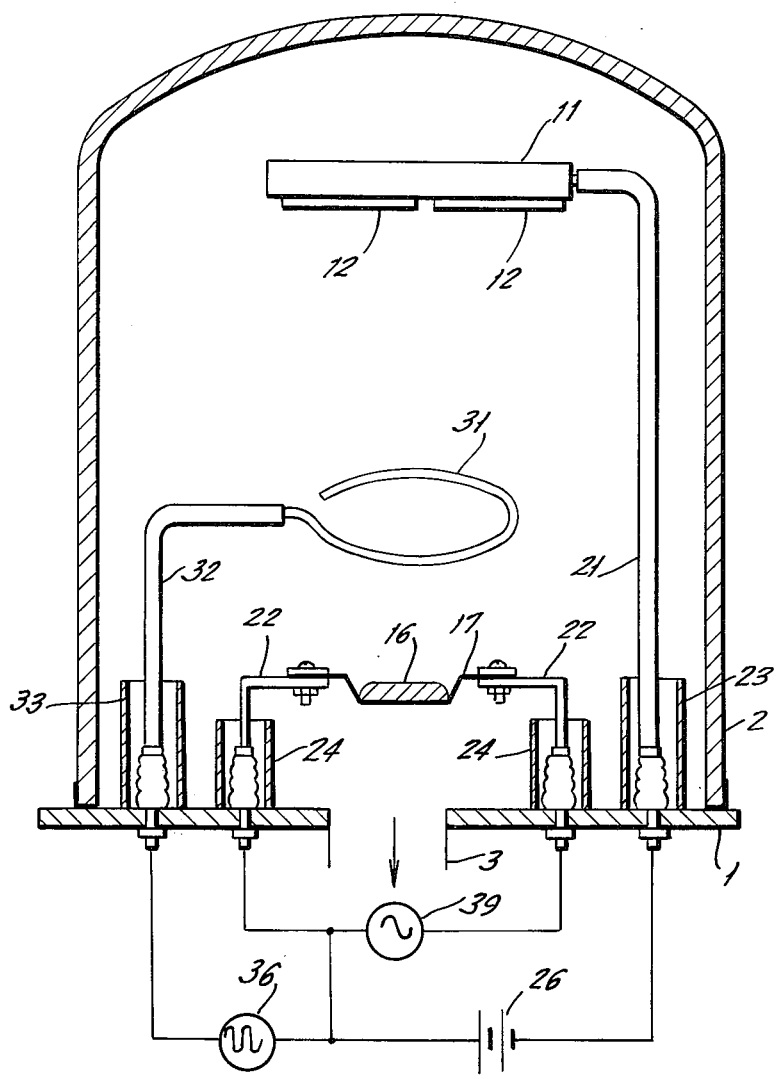
FIG. 1 is a schematic vertical sectional view of a first embodiment of the instant invention.

Referring to FIG. 1, ion-plating apparatus known in the art comprises a base plate 1 and a bell jar 2 placed on the base plate 1 to enclose a space in cooperation with the base plate 1. The space is evacuated through an exhaust tubing 3 and then back-filled with an inert gas. The apparatus further comprises a holder 11 for one or more substrates 12 to be ion-plated with a desired material, a source 16 for the desired material placed in a boat 17, and first means for producing a d.c. electric field between the source 16 and the holder 11. Here, the first means comprises an insulated high voltage lead 21 and a pair of conductors 22, both hermetically extended through the base plate 1. The insulated high voltage lead 21 further to support the holder 11 in the gas-filled space. The conductors 22 similarly serve to support the boat 17 in the gas-filled space facing the holder 11. Numerals 23 and 24 show shields for the insulated high voltage lead 21 and the conductors 22, respectively. The high voltage lead 21 and the conductors 22 are connected to a d.c. power source 26.

In accordance with the present invention, the ion-plating apparatus comprises second means for evaporating the material of the source 16. Here, the second means comprises the conductors 22 which now serve as current leads. The ion-plating apparatus further comprises third means for producing a high-frequency electric field in the gas-filled space to provide a high-frequency glow discharge region in the vicinity of the source 16. According to a first embodiment shown in FIG. 1, the third means comprises a high-frequency electrode 31 of a substantial ring shape supported in the gas-filled space and means for applying a high-frequncy electric voltage between the high-frequency electrode 31 and the source 16. The last-mentioned means comprises an insulated high voltage lead 32 hermetically extended through the base plate 1, which lead serves also as a support for the high-frequency electrode 31. Numeral 33 shows a shield for the insulated high voltage lead 32. Here, the high-frequency electrode 31 is disposed substantially perpendicularly of the d.c. electric field. In other words, the axis of the substantial ring shape is oriented parallel to the d.c. electric field. The apparatus is accompanied by a high-frequency power supply 36 for applying a high-frequency electric voltage between the high-frequency electrode 31 and the source 16 and a power supply 39 for resistive heating of the source 16.

In operation, a high-frequency glow discharge occurs near the high-frequency electrode 31. The evaporated particles of the material of the evaporation source 16 are ionized in this high-frequency flow discharge region. As described also in the preamble of the instant specification, the ionized particles are accelerated by the d.c. electric field towards the holder 11 and deposited on the substrate 12 to form a film of coating thereon.

With apparatus according to this invention, it should be pointed out that the ionization is carried out by the high-frequency glow discharge rather than a d.c. glow discharge as is the case with conventional apparatus. This makes it possible in the first place to keep the gas-filled space at a lower pressure, such as $10^{-3}$ Torr or less, of the back-filled inert gas. This, in turn, prevents impurities from mingling into the coatings and thus makes it possible to provide higher quality films. Secondly, the high-frequency glow discharge is more easily controlled than the d.c. glow discharge. This, in turn, enables the discharge to be controlled in compliance with the desired ion-plating to raise the efficiency of ionization of the evaporated particles, the speed of evaporation, and the quality of the coatings. Because of the high efficiency of ionization, it is possible with this invention to add an active gas in the gas-filled space to subject the evaporated particles to the chemical reaction with this active gas and to the ionization, thereby ion-plating the substrate 12 with the compound of the material of the source 16 with the active gas. For example, it is possible to plate the substrate 12 with silicon dioxide coatings by filling the space with a mixture of an inert gas and oxygen and using a silicon monoxide source 16. It should, however, be mentioned that the pressure in the gas-filled spaced is preferably higher than $10^{-5}$ Torr to insure reliable ionization of the evaporated particles. In other words, it is preferred that the pressure within the gas-filled space be between $10^{-3}$ and $10^{-5}$ Torr in order that the evaporated particles may reliably be ionized while passing through the high-frequency glow discharge region where ions of the inert gas are produced.

It should furthermore be noted that the substrate 12 is situated outside of the high-frequency glow discharge region where the ionization takes place. This avoids the unwanted bombardment of the substrate 12 by the charged particles, the undesired temperature rise of the substrate 12, and the back sputtering of the coatings being formed on the substrate 12. The substrate 12 may therefore be of a thermally fragile material, such as a base of a photograph film, a sheet of an organic material, a piece of a plastic material, or a wooden piece.

It is possible to use the apparatus according to this invention as a conventional vacuum evaporator with the source 16 merely heated by the second means without application of the d.c. and high-frequency electric voltages. Also, the apparatus may be used as a conventional ion-plating device with the d.c. electric voltage applied without application of the high-frequency electric voltage. In addition, it is possible prior to the ion-plating to clean the surface of the substrate 12 by ion bombardment with mere application of the d.c. voltage. The ion bombardment and ion-plating may repeatedly be carried out to deposit a high quality multi-layer coating on each substrate.

Apparatus according to this invention is capable of providing a coating that adheres to a substrate 12 as tenaciously as a coating obtained by the conventional electro-plating without giving rise to the problems of the bad smell and the harmful waste of the electro-plating.

Figure 2:
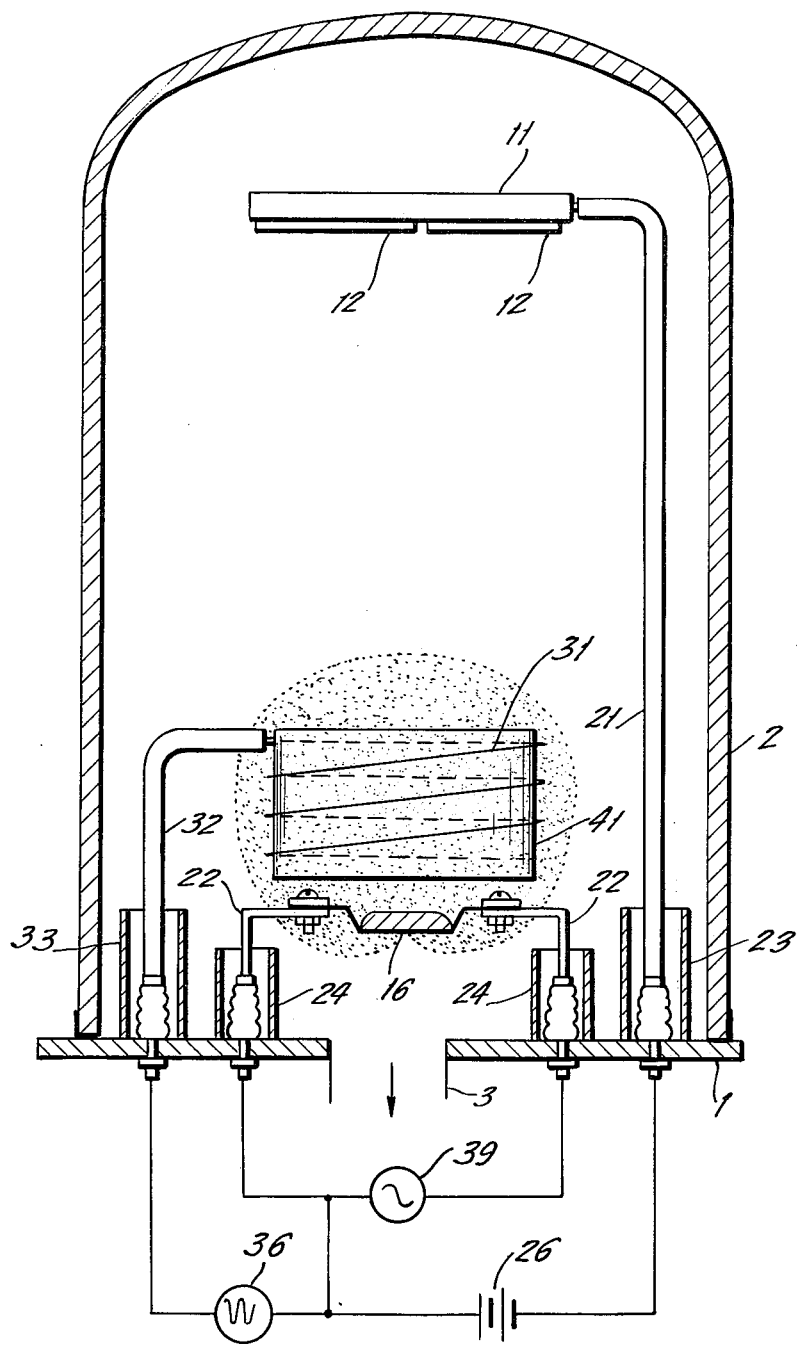
FIG. 2 is a similar view of a modification of the first embodiment.

Referring now to FIG. 2, a modification depicted therein comprises a cylinder 41 of an electrically insulating material, such as quartz, disposed in the gas-filled space with one of its ends placed adjacent to the source 16 and with its axis oriented parallel to the d.c. electric field. The high-frequency electrode 31 is disposed around the cylinder 41. With this modification, it is possible to confine the plasma of the high-frequency glow discharge within the cylinder 41 and thus to further raise the efficiency of ionization of the evaporated particles.

Figure 3:
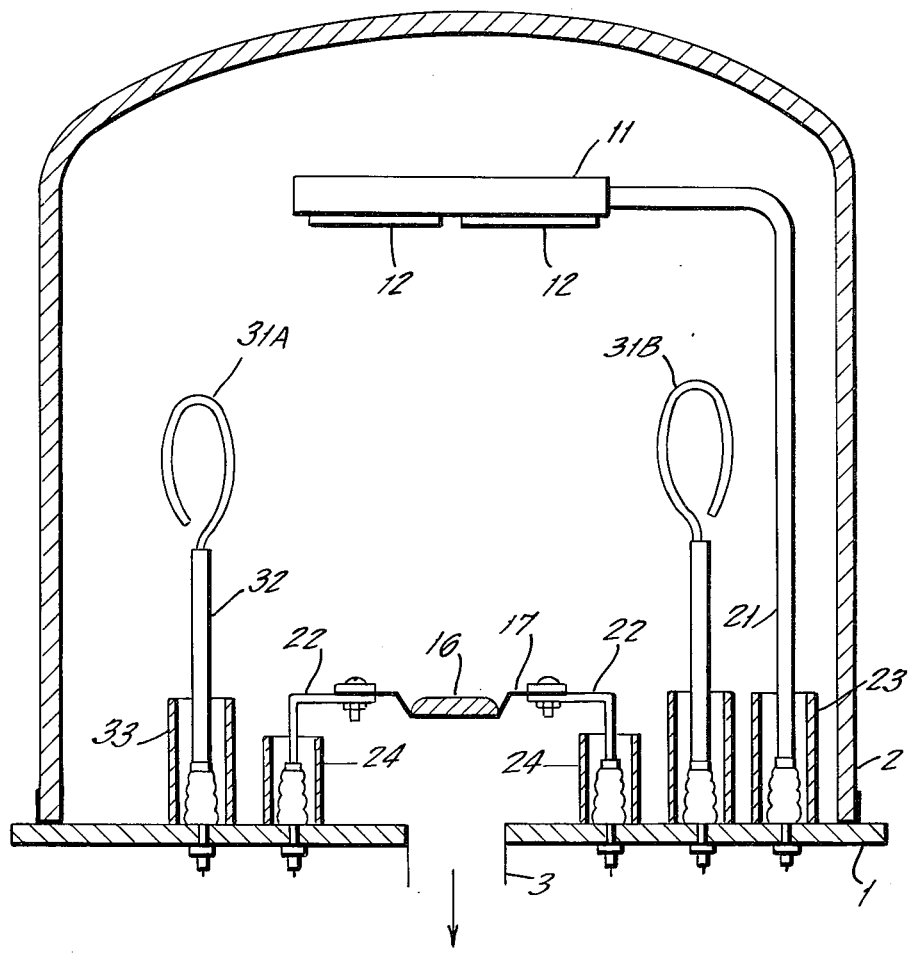
FIG. 3 is a similar view of a second embodiment of this invention.

Referring to FIG. 3, a second embodiment of this invention comprises a pair of high-frequency electrodes 31A and 31B disposed in the gas-filled space adjacent to the source 16 and offset with respect to the source 16 and the holder 11 instead of the single high-frequency electrode 31 illustrated with reference to FIG. 1. The high-frequency electric voltage may be applied between the high-frequency electrodes 31A and 31B on the one hand and the source 16 on the other hand. Alternatively, the high-frequency voltage may be applied between the electrodes 31A and 31B. The second embodiment is inferior to the first embodiment in that the ionized gas is less strongly confined in the high-frequency glow discharge region. Nevertheless, the second embodiment is capable of providing far better coatings on the substrates 12 than conventional ion-plating apparatus.

Figure 4:
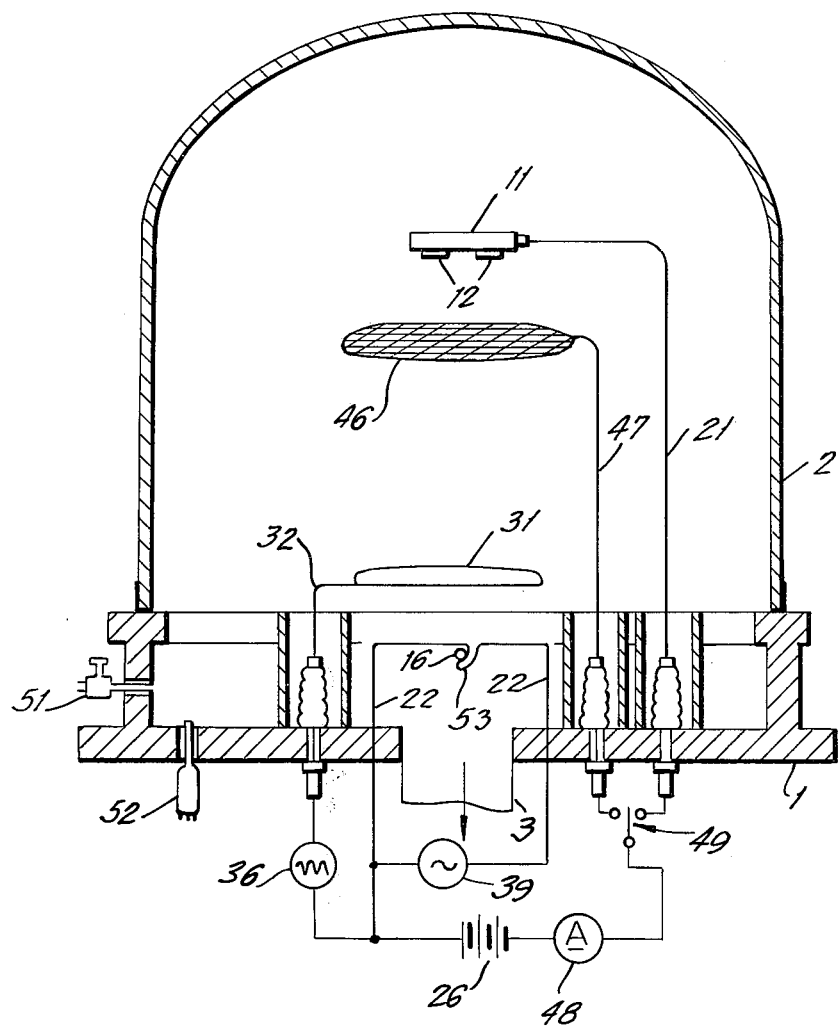
FIG. 4 is a similar view of a third embodiment of this invention.

Referring to FIG. 4, a third embodiment of this invention comprises a net electrode 46 supported in the gas-filled space adjacent to the holder 11 by an insulated high voltage lead 47 shown merely by a single line for simplicity of illustration. Here, the d.c. power source 26 is connected either to the insulated high voltage lead 21 of the holder 11 or to the insulated high voltage lead 47 of the net electrode 46 through an ammeter 48 and a switch 49. Also, a gas inlet valve 51 for the inert or active gas and a vacuum gauge 52, such as a Pirani gauge or an ionization manometer, are illustrated. Furthermore, the source 16 is placed in a heater 53 of a wire wound conically as symbolically depicted with a one-turn winding.

When the d.c. electric voltage is applied between the net electrode 46 and the source 16, most of the ionized particles penetrate through the net electrode 46 and reach the substrate 12 to form coatings thereon. It should be noted here in conjunction with the first and second embodiments that the d.c. electric field reaches the holder 11 and the substrates 12. The bombardment by the ionized inert gas of the substrates 12 and the coatings growing thereon is therefore not nil, although reduced as compared with the bombardment resulting in conventional ion-plating apparatus. In addition, the d.c. field concentrates on pointed portions of the substrates 12, in the case where the substrates 12 are conductors, to disturb the uniformity of the coatings. In contrast, the third embodiment is devoid of these inconveniences.

Figure 5:
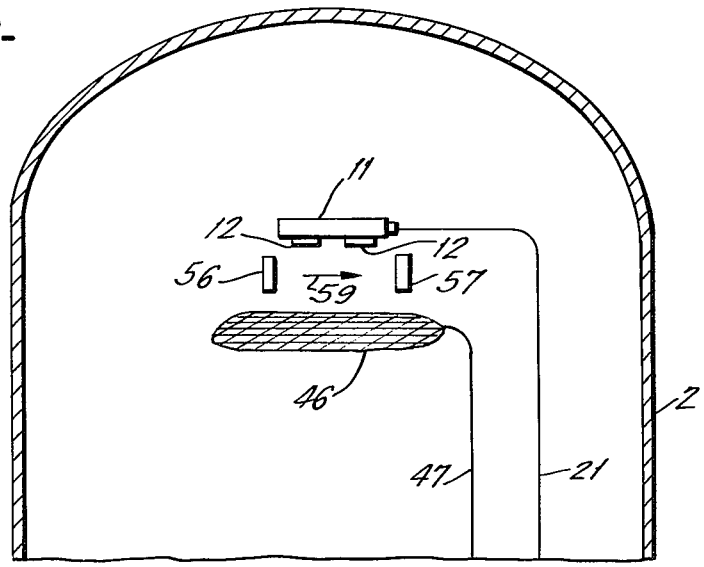
FIG. 5 is a partial schematic vertical sectional view of a modification of the third embodiment.

Referring to FIG. 5, a modification of the third embodiment comprises a pair of auxiliary electrodes 56 and 57 supported by means (not shown) in the gas-filled space between the net electrode 46 and the holder 11 and transversely aligned with respect to the d.c. electric field. The modification further comprises means (not shown) for applying a second d.c. electric voltage between the auxiliary electrodes 56 and 57 to produce an auxiliary d.c. electric field adjacent to the holder 11. Although there is substantially no d.c. field between the net electrode 46 and the holder 11, it will be appreciated that the auxiliary d.c. field is produced transversely of the direction of the d.c. field produced between the source and holder in the sense remarked in the preamble of this specification.

With this modification of the third embodiment, the ionized particles are subjected to acceleration by the auxiliary d.c. electric field in a direction shown by an arrow 59. As a result, the coating deposited on each of the substrates 12 exhibits an anisotropy in the direction of the arrow 59. The modification is therefore convenient to provide an anisotropic coating on a substrate 12, such as a magnetic thin film for a memory element.

Referring finally to FIG. 6, another modification of the first embodiment comprises a hollow cylindrical shield 61 for the high-frequency glow discharge region disposed in the gas-filled space around the high-frequency electrode 31. The shield 61 is provided with an opening at its end adjacent to the holder 11. The shield 61 is electrically connected to the source 16 through a switch 65. The shield 61 serves to confine the ionized particles within a chamber enclosed therewith. The shield 61 is made of an electrically conductive material. The switch 65 serves to keep the high-frequency glow discharge region substantially at the same electric potential as the evaporation source 16.

As a further modification, the apparatus illustrated in FIG. 6 comprises a duct 66 connecting the valve 51 to the chamber defined by the shield 61. The inert gas or a mixture of an inert gas and an active gas may be introduced into the chamber through the duct 66. Alternatively, use may be made of another duct (not shown) for separately introducing adjusted amounts of an inert gas and an active gas into the chamber. Incidentally, a shutter 68 and a support 69 therefor are illustrated in FIG. 6 for controlling the deposition of the ionized particles on the substrates 12.

While several embodiments of this invention and modifications thereof have thus far been described, it will now readily be understood that the high-frequency electrode 31 or electrodes 31A and 31B may be a coil or coils through which a high-frequency electric current is caused to flow. Alternatively, the offset high-frequency electrode or electrodes, such as 31A and/or 31B FIG. 3, may be used together with the substantially ring-shaped high-frequency electrode 31 in case the gas-filled space is of a large size. In addition, the third means may be a coil (not shown) disposed outside of the gas-filled space adjacent to the source 16 and means for supplying a high-frequency electric current to the coil. In this alternative case, it is necessary that the bell jar 2 be made of glass or other electrically nonconductive materials. The second means for heating the source 16 to evaporate the material thereof may be means for subjecting the source 16 to an electron beam. Although the illustrated apparatus have the holder 11 and the source 16 aligned in the vertical direction, it wil be appreciated that this invention is equally well applicable to a device in which the source 16 and the holder 11 or holders are aligned horizontally or otherwise.

What is claimed is:

1. Apparatus for coating substrate with a material including: a gas-filled space, a source of said material positioned in said gas-filled space, a holder for said substrate enclosed in said gas-filled space, first means for producing a d.c. electric field between said source and said holder for carrying out the coating, and second means for heating said source to evaporate the material thereof, wherein the improvement comprises third means disposed intermediate said holder and source for producing a high-frequency electric field in a selected portion of said gas-filled space intermediate said source and said holder to provide a high-frequency glow discharge region adjacent said source for ionizing said evaporated material, whereby said ionized evaporated material is accelerated toward said holder by said d.c. electric field.

2. Apparatus as claimed in claim 1, wherein the pressure of gas filled in said gas-filled space is of the order of from $10^{-3}$ to $10^{-5}$ Torr.

3. Apparatus as claimed in claim 1, wherein said third means comprises a high-frequency electrode of a substantial ring shape disposed in said gas-filled space between said source and holder and means for applying a high-frequency electric voltage between said high-frequency electrode and said source.

4. Apparatus as claimed in claim 3, wherein said high-frequency electrode has an axis of said substantial ring shape oriented parallel to said d.c. field.

5. Apparatus as claimed in claim 4, further comprising a hollow cylinder of an electrically insulating material disposed in said gas-filled space with one of its ends placed adjacent to said source and with its axis oriented parallel to said d.c. field, said high-frequency electrode being disposed around said cylinder.

6. Apparatus as claimed in claim 3, further comprising a shield for said high-frequency glow discharge region disposed in said gas-filled space around said high-frequency electrode, said shield having an opening at its end adjacent to said holder.

7. Apparatus as claimed in claim 6, further comprising means for introducing an inert gas into a chamber surrounded by said shield, whereby said substrate is coated with the material of said source.

8. Apparatus as claimed in claim 6, further comprising means for introducing an inert gas and an active gas into a chamber surrounded by said shield, whereby said substrate is coated with a compound produced by a chemical reaction of the material of said source with said active gas.

9. Apparatus as claimed in claim 1, wherein said third means comprises a high-frequency electrode disposed in said gas-filled space between said source and holder and offset with respect to said source and holder and means for applying a high-frequency electric voltage between said high-frequency electrode and said source.

10. Apparatus as claimed in claim 1, wherein said third means comprises a coil disposed in said gas-filled space adjacent to said source and means for supplying a high-frequency electric current to said coil.

11. Apparatus as claimed in claim 1, wherein said third means comprises a pair of high-frequency electrodes disposed in said gas-filled space adjacent to said source and means for applying a high-frequency electric voltage between said high-frequency electrodes.

12. Apparatus as claimed in claim 1, wherein said third means comprises a coil disposed outside of said gas-filled space adjacent to said source and means for supplying a high-frequency electric current to said coil.

13. Apparatus as claimed in claim 1, wherein a net electrode is disposed in said gas-filled space adjacent to said holder and said first means comprises means for applying a d.c. electric voltage between said net electrode and said source to produce said d.c. electric field.

14. Apparatus as claimed in claim 13, further comprising a pair of auxiliary electrodes disposed in said gas-filled space between said net electrode and said holder and means for applying a second d.c. electric voltage between said auxiliary electrodes to produce an auxiliary d.c. electric field transversely of the d.c. electric field produced by said first means.

15. Apparatus as claimed in claim 1, wherein said gas-filled space is filled with an inert gas, whereby said substrate is coated with the evaporated material of said source.

16. Apparatus as claimed in claim 1, wherein said gas-filled space is filled with a mixture of an inert gas and an active gas, whereby said substrate is coated with a compound produced by a chemical reaction of the material evaporated said source with said active gas.

17. Apparatus for coating a substrate with a material including: a gas-filled space, a source of said material positioned in said gas-filled space, a holder for said substrate enclosed in said gas-filled space, first means for producing a d.c. electric field between said source and said holder for carrying out the coating, and second means for heating said source to evaporate the material thereof, wherein the improvement comprises third means disposed intermediate said holder and source for producing a high-frequency electric field in a selected portion of said gas-filled space intermediate said source and said holder to provide a high-frequency glow discharge region adjacent said source for ionizing said evaporated material, the pressure in said gas-filled space being of the order of from $10^{-3}$ to $10^{-5}$. Torr, whereby said ionized evaporated material is accelerated toward said holder by said d.c. electric field and said reduced pressure in said gas-filled space remarkably reduces the undesirable bombardment of the substrate surface by inactive gas ions.

\* \* \* \* \*